(12) United States Patent
Gordon et al.

(10) Patent No.: US 6,262,425 B1
(45) Date of Patent: Jul. 17, 2001

(54) CURVILINEAR AXIS SET-UP FOR CHARGED PARTICLE LITHOGRAPHY

(75) Inventors: Michael S. Gordon, Lincolndale, NY (US); Paul F. Petric, Pleasanton, CA (US); Christopher F. Robinson, Hyde Park; James Rockrohr, Hopewell Junction, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/266,335

(22) Filed: Mar. 11, 1999

(51) Int. Cl.[7] ................................................. H01J 37/147
(52) U.S. Cl. ........................................ 250/491.1; 250/397
(58) Field of Search ..................................... 250/491.1, 397

(56) References Cited

U.S. PATENT DOCUMENTS

| | | | |
|---|---|---|---|
| 4,524,277 | * | 6/1985 | Shimura et al. ..................... 250/397 |
| 4,568,861 | * | 2/1986 | Doran et al. ......................... 250/397 |
| 4,939,371 | * | 7/1990 | Goto ................................. 250/491.1 |
| 5,635,719 | | 6/1997 | Petric ............................. 250/396 ML |

* cited by examiner

Primary Examiner—Jack Berman
(74) Attorney, Agent, or Firm—McGuireWoods (57) ABSTRACT

Keyhole shaped slit apertures, sized and oriented to define a desired deflected beam trajectory, such as a planar curvilinear trajectory, are provided for respective deflectors of a charged particle beam system. The beam is statically deflected to a maximum deflection using all deflectors above/prior to a particular slit aperture along the path of the charged particle beam and then scanned in directions orthogonal and parallel to the direction of static deflection while recording current of the charged particle beam intercepted by edges of each slit aperture, in sequence. Correction of deflector alignment and/or driver current (or voltage) is made based on recorded intercepted beam current. The sequence of correction is repeated for calibration, deflection/axis compensation, beam centering and deflection gain and axis compensation parameter adjustment.

15 Claims, 9 Drawing Sheets

CURVILINEAR AXIS SET-UP FOR CHARGED PARTICLE LITHOGRAPHY

BACKGROUND OF THE INVENTION

1. Field of the Invention

The present invention generally relates to high resolution lithography systems using charged particles for exposure of a resist and, more particularly, to alignment procedures for forcing a charged particle beam to follow a planar curvilinear trajectory.

2. Description of the Prior Art

Lithographic processes are generally required in the manufacture of semiconductor integrated circuits. Even though there is a trend in the manufacture of integrated circuits to employ processes and element designs in which many processes are carried out in a self-aligned manner (both to avoid some lithographic processes and to produce structures at smaller size than can be accomplished lithographically), at least one lithographic process to define element locations is invariably required.

Additionally, the small feature sizes of modern and foreseeable integrated circuits require extremely high-resolution exposures of the resist to be made. The lithographic technology almost exclusively in use in the industry at the present time is based on the use of electromagnetic radiation (EMR) as the exposure medium of choice to expose the resist. Optical technology has advanced to the point that resolution is essentially limited by diffraction (or, more generally, interference effects of the radiation) but not significantly by imperfections of the optics known as aberrations. Diffraction is determined by the wavelength of the light used to expose the resist and is of generally lesser impact at shorter wavelengths.

Accordingly, the trend in the industry has been toward the use of shorter wavelengths of electromagnetic radiation to accommodate advances in integrated circuit manufacture allowing smaller dimensions and closer proximity of circuit elements. The current consensus in the industry is that the use of EMR is restricted to a wavelength of 193 nm (nanometers) which is in the deep ultra-violet (DUV) range and is believed to provide a maximum resolution supporting minimum pattern dimensions of between 130 and 180 nm.

Major efforts beyond this feature size limit are directed toward use of an extended range of electromagnetic radiation having wavelengths in the extreme ultra-violet (EUV) range and even X-rays. Use of charged particle (electron or ion) radiation, however, provides an alternative exposure medium for high resolution lithography. Use of either electrons or ions is not limited by diffraction effects but by other factors at the present state of the art. Such other factors include aberrations which are the equivalent of optical aberrations, often referred to as geometric aberrations, Coulomb interactions between the like-charged particles and interaction with the materials of the target toward which the particles are directed which results in scattering of the particles, causing an exposure effect known as proximity effect. While these effects are common to beams of either electrons or ions, electron beams are of primary interest in this context.

It is well-known that electron beams are readily controllable by magnetic and electric fields in the vicinity of the beam. Such control has been exploited for lithography in industry and research for about thirty years almost exclusively in configurations known as probe-forming systems. More recently, to accommodate smaller feature sizes and to increase throughput of the e-beam exposure tool, so-called electron beam projection systems have been developed which project a relatively large pattern formed in a reticle and containing millions of image elements simultaneously onto the target (e.g. a wafer). In either case, it is critical that the trajectory of the beam be closely controlled.

It is also well-recognized that the resolution of charged particle systems is degraded by Coulomb interactions between like-charged particles. This degradation of resolution generally increases with the length of the electron beam but is reduced with reduced electron density in the beam. For this reason, the beam is maintained as diffuse as possible over its length and the length is generally minimized consistent with the electron-optical configuration. As discussed in U.S. Pat. No. 5,635,719 to Petric, assigned to the assignee of the present invention and hereby fully incorporated by reference the "variable curvilinear optical axis" allows for a beam to be deflected within the magnetic field of a lens rather than the prior art solutions (U.S. Pat. No. 4,859,856 and U.S. Pat. No. 4,544,846) where the beam is deflected in a magnetic field-free environment. This allows for a much shorter electron column which can reduce the effect of the Coulomb interactions.

As is known, a magnetic field will alter the trajectory of the individual electrons in the beam. The distribution of motions of the individual electrons will generally be such that the electrons can be collectively treated as a beam even though the beam may be relatively diffuse over much of its length, as alluded to above. Whether considered individually or collectively, the electron or electron beam trajectory, off the electron-optical axis of a lens, will generally have a characteristically helical component imparted by magnetic lens fields in the electron-optical system.

A special case of the electron beam trajectory occurs, however, if a component of the radial field of a lens is canceled by a suitably aligned deflection field, hereafter referred to as an axis-compensation field. In this special case, the curvilinear axis of the beam will theoretically be confined to a plane which also contains the axis of the e-beam system. Unfortunately, correct alignment of the axis-compensation fields, to confine the beam to a planar path along the column length, is very difficult to achieve. Of course, the general case of the curvilinear deflection is one which does not restrict the beam to lie within a plane.

Moreover, in electron beam projection systems, resolution is sensitive to beam position. When the beam follows a curvilinear path, resolution will be optimized. Such a beam path can be predicted by currently available, computer-implemented modeling techniques which can then specify excitation values for the various deflectors and lenses of the system. However, due to imperfections in the fabrication of any e-beam system, modeling techniques which assume ideal or at least well-behaved lens and deflector performance do not provide sufficiently accurate information to maximize resolution. Accordingly, an experimental technique is necessary to assure that the electron beam follows the correct optical path in practice.

Misalignment of the axis-compensation field with the radial field component of a lens also leads to subfield distortions and placement errors. Such errors can occur by misalignment at any electron-optical element (which will generally number between ten and twenty) of the e-beam tool and the distortion and placement errors are potentially cumulative throughout the e-beam column of the tool.

SUMMARY OF THE INVENTION

It is therefore an object of the present invention to provide an apparatus and methodology by which a charged particle beam can be aligned according to a curvilinear variable axis as described in the above-incorporated U.S. Pat. No. 5,635,719.

In order to accomplish these and other objects of the invention, alignment is determined by reference to variable-width slit apertures located within the vacuum of a charged-particle column. The beam is statically deflected in one direction to it's maximum extent, using all of the deflectors above the aperture plate of interest, then it is scanned in two orthogonal directions by one or more deflectors above the aperture plate of interest over the edges of a given aperture plate and the beam current is recorded as it is intercepted on the aperture plate. The beam is then statically deflected in the opposite direction to it's maximum extent, and then is scanned in two orthogonal directions by one or more deflectors above the aperture plate of interest over the edges of the same aperture plate and the beam current recorded as it is intercepted on the aperture. From the intercepted current on the aperture, as a function of the two sets of scans, the beam position is established, and means are provided for correcting the trajectory so that it matches that which is predicted by theory. Iterations of this procedure over the length of the column establish a desired curvilinear path.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
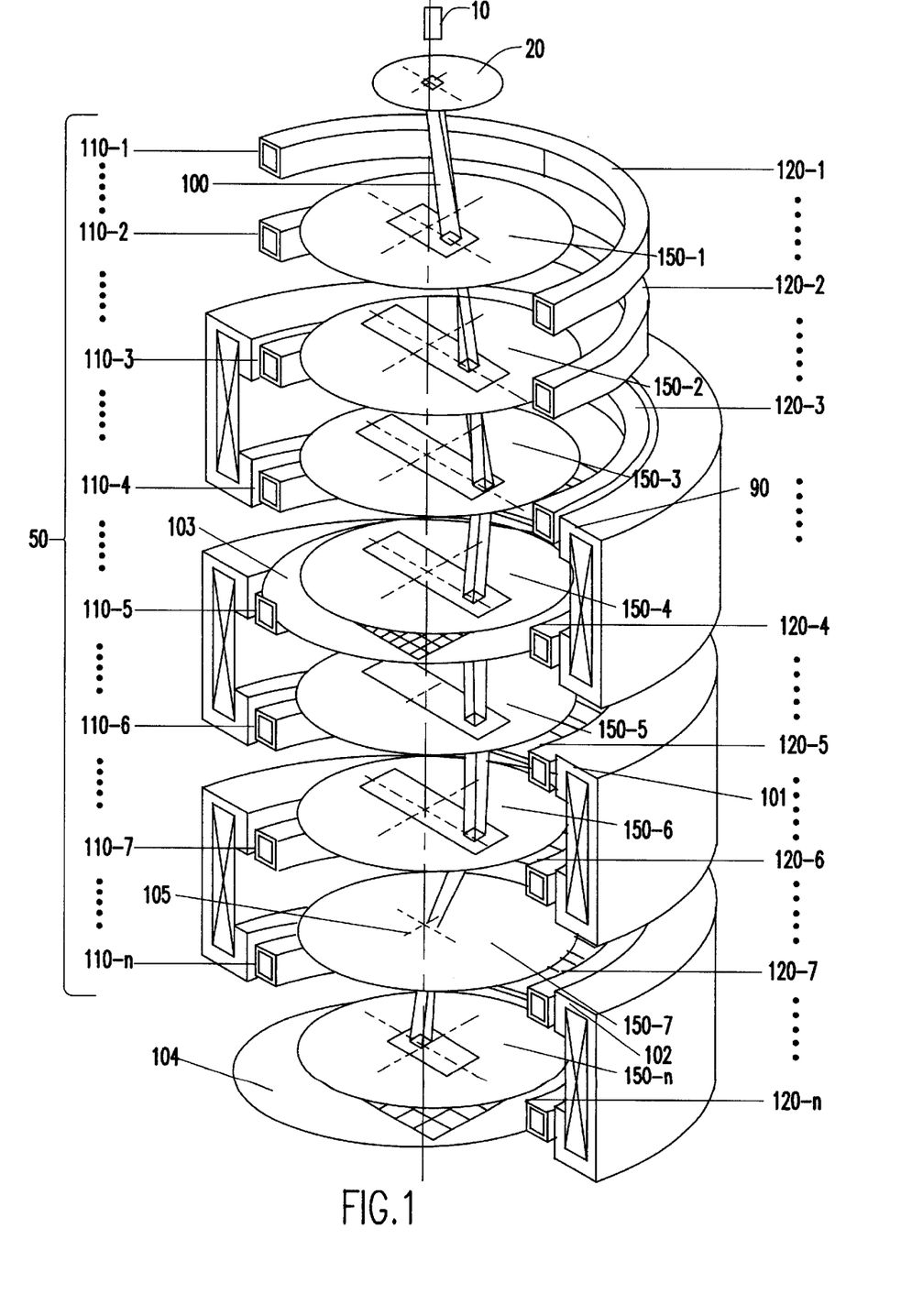
FIG. 1 is a schematic representation of a section of a projection lithography tool, illustrating magnetic lenses, deflecting and axis-compensation yokes, as well as variable-width slit apertures on which the invention is implemented.

Referring now to the drawings, and more particularly to FIG. 1, there is shown a section of a projection system 50 of the type described in U.S. Pat. No. 5,635,719. Lens coils such as 90, 101 and 102 are shown symbolically as single coils, but may consist of a plurality of coils or windings to generate a magnetic field of the appropriate shape used to project an image of a beam-defining aperture contained in the upper-column optics shown symbolically as 20 to a reticle subfield 103 and finally to the target 104. The lenses which these coils comprise are generally referred to as "illuminator", "collimator" and "projector" lenses, respectively, since the object of the lens 90 is to illuminate the reticle subfield, lens 101 collimates the image of the reticle subfield, 103, whereas lens 102 projects the image to the target 104. Additionally, lens coil 101 images the charged-particle beam crossover to the back focal point 105 of the projector lens 102. Highly-stable current drivers provide the static current, and adjustment for these and other lenses in the charged-particle system.

Shown distributed preferably uniformly along the axial direction, throughout the illuminator 90, collimator 101 and projector 102 are deflectors 110-1 to 110-n, axis compensation yokes 120-1 to 120-n, and variable-width slit apertures 150-1 to 150-n. The vertical dots in FIG. 1, between the deflectors 110-1 to 110-n and the axis compensation yokes 120-1 to 120-n indicate that either fewer or additional deflectors and/or axis compensation yokes could be included in the projection system as desired, but for ease of viewing, only 7 are shown.

The deflectors above the reticle 103 are analogous to those shown in FIG. 1 in U.S. Pat. No. 5,635,719 as 5, 7, 55 and 57. The deflectors between the reticle 103 and target 104 are analogous to those shown in FIG. 1 in U.S. Pat. No. 5,635,719 as 105, 107, 205 and 207 therein and the axis-compensation yokes are analogous to those in the aforementioned patent, FIG. 1, 150-1 to 150-n and 250-1 to 250-n. However, in the present invention, axis-compensation yokes are included above the reticle 103, as shown in FIG. 1.

Although not necessary for the successful implementation of this invention, each deflector, 110-1 to 110-n has associated with it, an axis compensation yoke 120-1 to 120-n, at the same axial position. As discussed in the background section of U.S. Pat. No. 5,635,719, the deflection field can be oriented to occur in one axis and the axis compensation field in an orthogonal axis, and thus a single yoke consisting of windings that generate magnetic fields in mutually orthogonal orientations can be used as both deflection and axis compensation yokes. It will be evident to those skilled in the art that electric deflectors could be used in place of the magnetic deflectors.

For projection systems of the like described in U.S. Pat. Nos. 5,316,879 assigned to Berger, et. al., 5,466,904 assigned to Pfeiffer, et. al., and 5,635,719, assigned to Petric, the subfields at the reticle are on the order of 1 mm$^2$, and the magnification of the projection system is on the order of ¼ or, alternatively expressed, a demagnification ratio of 4:1. The shape and dimensions of the beam as it propagates from the reticle to the target therefore varies from square (at the reticle 103 and target 104) to Gaussian (at the back focal point, 105, of the projector lens 102) and from ≈1 mm to ≈¼ mm from the reticle to the target.

Figure 2:
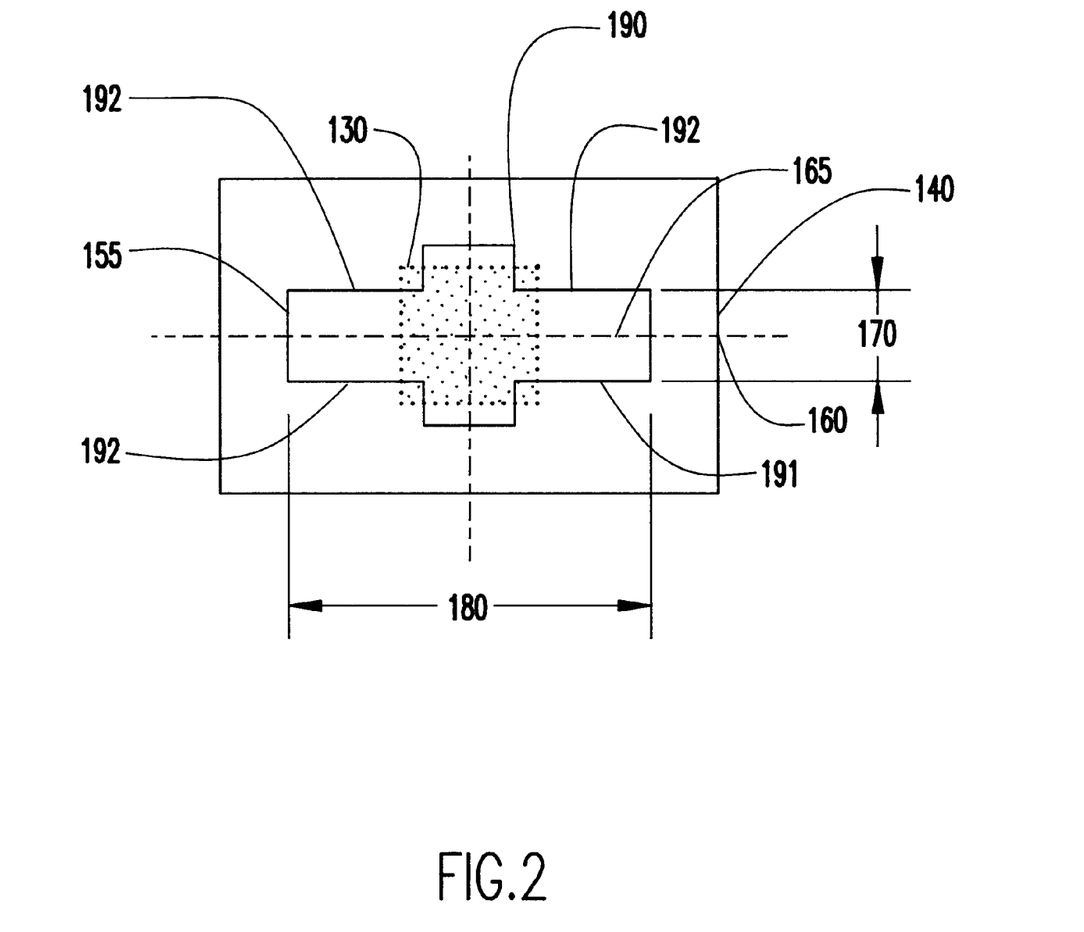
FIG. 2. is a schematic representation of an individual variable-width slit aperture.

In accordance with the invention, immediately below each deflection yoke 110-1 to 110-n (and axis-compensation yokes 120-1 to 120-n) is a variable-width slit aperture, 150-1 to 150-n. The preferred geometry of one such variable-width slit aperture is shown in FIG. 2. It is recognized that other shapes for the opening are possible, but for clarity, one such shape is shown herein to convey an understanding of the principles of the invention. The opening, 165 in the aperture plate 160 is keyhole-shaped and rectangular. The narrower dimension 170 of the opening 165 is several times greater than the maximum extent of the beam. As described below, the beam is deflected using all of the deflectors above each variable-width slit aperture 150-1 to 150-n, then scanned using one or two deflection yokes immediately above the variable-width aperture of interest. The width 180 of each variable-width aperture in the example shown in FIG. 2 is thus made slightly larger than the expected position of the beam when deflected at the axial position of each of the variable-width slit apertures 150-1 to 150-n.

Figure 3:
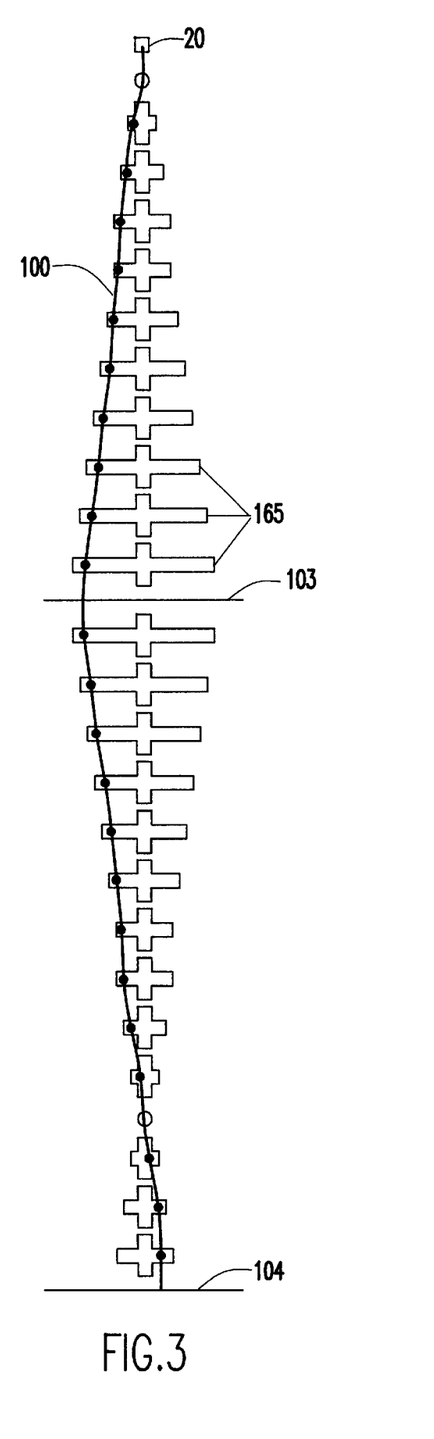
FIG. 3 is a schematic representation of a series of variable-width slit apertures.

Curve 165 in FIG. 3 of U.S. Pat. No. 5,635,719 shows an example of the radial position of a beam of particles as it travels from the reticle to the target. The overall path of the beam is shown in FIG. 3 of the present application. Many variable-width slit apertures are shown in this figure, both above and below the plane of the reticle 103. The number of yokes and variable-width slit apertures is chosen so that the planar deflection (and axis-compensation) is smoothly-varying, axially. The radial extent of the deflection, at the axial position of the variable-width slit apertures 150-1 to 150-n, shown by 100 in FIG. 1, can be theoretically determined as described in the prior art. In a preferred embodiment of the current invention, the length 170 of the opening 165 in the aperture plate 160, shown in FIG. 2, is 3 mm, and the width 180 is 3 mm longer than the expected deflection at axial location of the apertures 150-1 to 150-n, as calculated. Errors in the position of the undeflected beam are thus detectable by current intercepted by the aperture plate at corners of the "keyhole" shape formed by the longer portion 190 of the variable width slit aperture. Each "keyhole" opening, shown by 190 in FIG. 2 located in the center of the aperture plate 160 is 2 mm long (beyond the 3 mm length of the opening as described above) and 2 mm wide, and is used to assess the alignment of the beam in the undeflected condition, relative to the position of the slit aperture, as discussed below.

It is assumed, but not necessary to the successful implementation of this invention, that the long-axis, 180 of each of the variable-width slit apertures 150-1 to 150-n, have been oriented, rotationally, such that they are aligned to the desired planar deflection direction. It is further assumed, that this direction lies along one of the orthogonal axes of both the reticle and the wafer stages, that is the long axis of the variable-width slit apertures lie along either the "X" or the "Y" stage axes.

In the generalization of this invention, where the deflection is not constrained to lie along a plane, the apertures could be rotated away from the "X" and "Y" stage directions. In this case, the rotational angle of each aperture could be adjusted to match the predictions from a model.

As taught by Petric, in U.S. Pat. No. 5,635,719, specifically in FIG. 1, the variable curvilinear axis describes a planar deflection above and below a reticle. Without the aid of the combination of deflection yokes 110-1 to 110-n and axis-compensation yokes 120-1 to 120-n, the deflection trajectory would be helical. The object of this invention is to describe a technique for determining the current applied to both the deflection 110-1 to 110-n and axis-compensation yokes 120-1 to 120-n, such that the deflection of the beam is planar, and that the beam has the proper radial displacement at the position of each of the variable-width slit apertures in the electron beam column.

Figure 4:
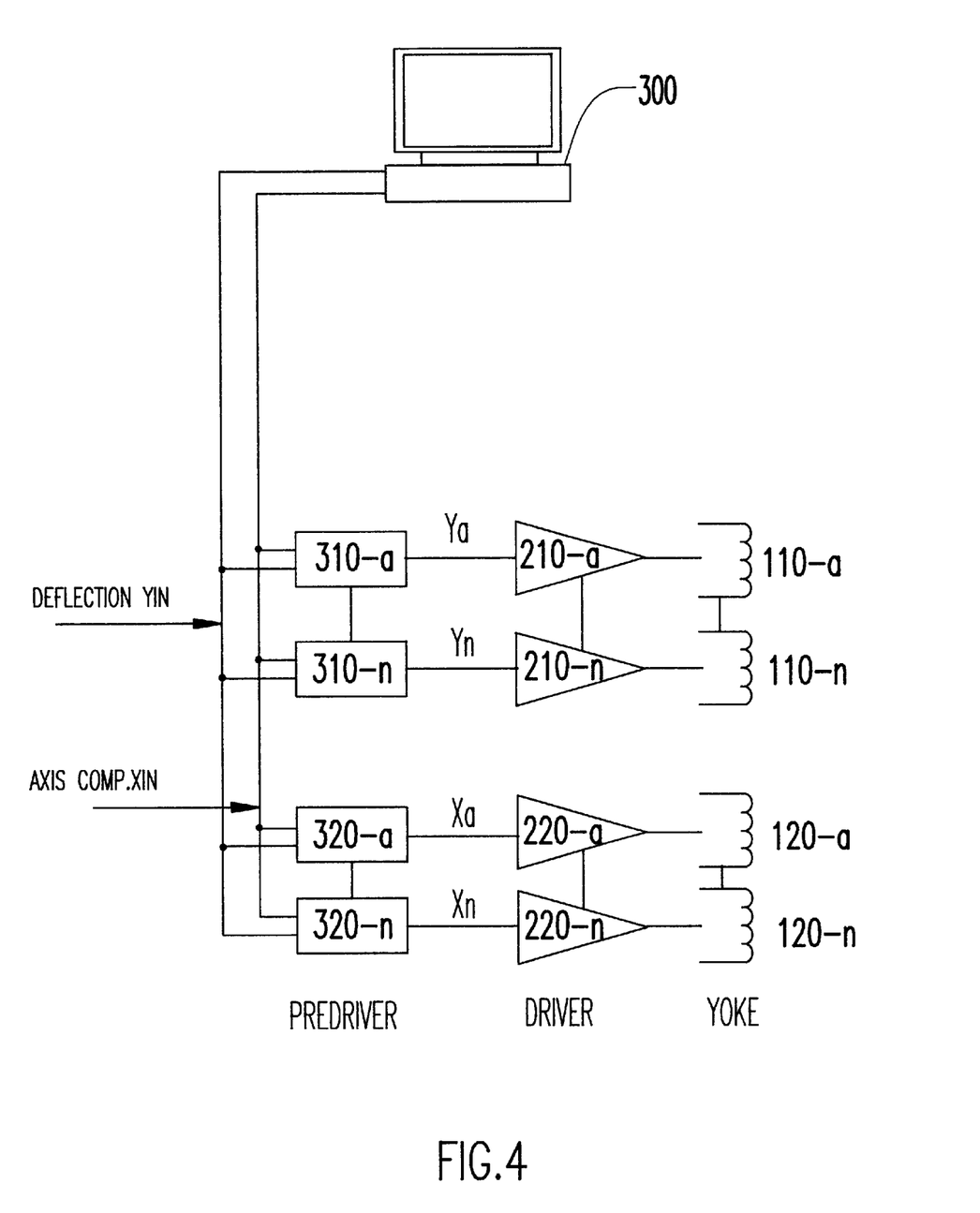
FIG. 4 is a schematic representation of the deflection electronics and control system.

FIG. 4 shows schematically a control computer, and other elements which allow for a manual or automatic setup of the currents required for the deflection and axis-shifting yokes so that the beam's deflection is planar and lies along the predetermined planar curvilinear path. Of course, it is recognized that the functions of the deflection and axis-shifting yokes, could be performed, by electrostatic deflection elements. To that end, in the ensuing discussions, the terms "current" and "current drivers" could be replaced with "voltage" and "voltage drivers" if the deflection and axis-shifting yokes were electrostatic rather then magnetic. For ease of description of the curvilinear axis setup technique, each deflection yoke 110-1 to 110-n and axis-compensation yoke 120-1 to 120-n are described as being physically part of the same yoke, i.e., deflection yoke 110-1, and axis-compensating yoke 120-1, are orthogonal axes of the same yoke, and so on.

In the ensuing discussion the combination of deflection yokes 110-1 to 110-n and axis-compensation yokes 120-1 to 120-n, will be referred to as yokes 200-1 to 200-n. Each such yoke (200-1, 200-n) is oriented, rotationally, such that the deflection of the beam (caused by deflection yoke 110-1), in the absence of a lens field, lies generally along the long axis 180 of the variable-width slit apertures, 150-1 to 150-n (Y axis) and the axis-shifting yoke (120-1 to 120-n), deflects the beam in the orthogonal direction with respect to the deflection yoke (110-1), or along the narrow direction 170 of the variable-width slit apertures 150-1 to 150-n (X axis). The assignment of the deflection yoke direction to the Y direction and the axis-compensation yoke direction to the X direction, is simply to aid in the description of the setup technique. It is clear that this assignment could be reversed (provided that the variable-width slit apertures 150-1 to 150-n were rotated 90°), and the resulting discussion could be modified.

As shown in FIG. 4, separate magnetic current drivers 210-1 to 210-n are connected to each of the deflection yokes 110-1 to 110-n. Analogously, magnetic current drivers 220-1 to 220-n are connected to each of the axis-compensation yokes 120-1 to 120-n. Similarly, there exist magnetic "predrivers" 310-1 to 310-n and 320-1 to 320-n attached to the magnetic current drivers 210-1 to 210-n, and 220-1 to 220-n, respectively, for the deflection and axis-compensation yokes. The magnetic predrivers, 310-1 to 310-n and 320-1 to 320-n, contain multiplying Digital to Analog Converters (MDAC's). As described in the remainder of this application, the software in the control computer, 300 performs mathematical transforms to control the outputs of the magnetic predrivers 310-1 to 310-n and 320-1 to 320-n.

Curvilinear-Axis Setup Algorithm

General Terms:

As used herein, the variables $Y_i$ and $X_i$ refer to the voltage output of the $i^{th}$ deflection (310-i) and axis-compensating yoke (320-i) predriver respectively, and $Y_{in}$ and $X_{in}$, are applied (simultaneously) to all of the inputs of the yoke predrivers, 310-1 to 310-n and 320-1 to 320-n as shown in FIG. 4. Mathematical transformation, are described below which associate the $X_i$, $Y_i$ (output of each) with the $X_{in}$, $Y_{in}$ (input to all) of the predrivers. Bear in mind during the following discussion that each of the five stages of alignment technique are performed for each yoke 200-i in sequence from 200-1 to 200-n prior to proceeding to the next stage which is similarly performed sequentially and iteratively through the respective yokes.

(1) Calibration

The gain of each deflection yoke driver 210-1 to 210-n and each axis-compensation yoke driver 220-1 to 220-n can be adjusted to accommodate differences in the sensitivities of individual drivers or the yokes (either deflection 110-1 to 110-n and/or axis-compensating 120-1 to 120-n). This can be especially useful to compensate for inaccuracies in the manufacturing of the yokes, and/or to obtain nearly identical sensitivities in both axes of saddle-type yokes, where one axis is generally less sensitive than the other. In practice, the deflection sensitivity of both axes of the $i^{th}$ yoke (including the driver sensitivity) could be measured by scanning the beam over a target and computing the deflection sensitivity (mA/mrad) in the absence of lens fields.

In accordance with the invention, such a target is preferably provided by the keyhole portion 190 of the slit aperture immediately below each respective yoke. That is, by small deflection from the axial position of the beam, the sensitivity of the deflection and axis correction yokes will be determinable as a function of the current intercepted by the aperture plate as the beam is scanned in a two-dimensional path over the aperture. Once the sensitivities of all n yokes 110-1 to 110-n, and 120-1 to 120-n and their drivers are known, individual calibration terms $Y_{cal-i}$ and $X_{cal-i}$ for the deflection and axis-compensation yokes, respectively, could be applied as follows:

$$X_i = X_{in} X_{cal-i}$$

$$Y_i = Y_{in} Y_{cal-i}$$

(2) Deflection/Axis Compensation Orientation

As mentioned earlier, the wide direction, 180 of the variable-width slit apertures, 150-1 to 150-n, defines the planar deflection direction, and therefore they must be installed with great precision to ensure that there is no rotation of any aperture with respect to the travel of either reticle or wafer stage. As mentioned earlier, both yokes can be orthogonal windings of the same yoke. There can be a mechanical misorientation of the deflection yokes, 110-1 to 110-n, and/or the axis Compensation yokes, 120-1 to 120-n (in the absence of magnetic lens fields) with respect to the variable-width slit apertures, 150-1 to 150-n, or to the travel of either the reticle or wafer stages. In any case, it is possible to correct the direction of the deflection of the deflection yokes 110-1 to 110-n, and the axis compensation yokes, 120-1 to 120-n, so that in a magnetic-field-free region the deflection lies along the slit direction using the terms as follows:

$$X_i = \{X_{in}\cos(\theta_i) - Y_{in}\sin(\theta_i + \delta\theta_i)\} X_{cal-i}$$

$$Y_i = \{Y_i \cos(\theta_i + \delta\theta_i) + X_{in}\sin(\theta_i)\} Y_{cal-i}$$

In practice, for each yoke 200-i, the beam is raster-scanned using drivers 210-i and 220-i in the Y and X directions respectively, and the beam current recorded that is intercepted by the variable-width slit aperture 150-i immediately below the yoke 200-i. In other words, once the system is calibrated to determine gain values for each of the deflection and axis compensation drivers, raster scanning (which after calibration, is in a pattern of consistent dimensions) is performed by each yoke, in sequence. Angle-correction terms, $\theta_i$, and $\delta\theta_i$ are adjusted so that the features in an image of the variable-width slit aperture appear orthogonal and parallel to the X and Y scanning axes.

(3) Offsets to center beam in slit apertures

As shown in FIG. 3, many of the slit apertures in the vicinity of the reticle are particularly wide, and it would require rather large currents to observe the right 140 and left 155 edges of slit apertures when raster scanning the corresponding deflection yoke. The keyhole opening 190 in the aperture plate 160, however, can be used with moderate deflection currents, to assess the beam's position relative to the slit aperture 165, with a resulting scan path 130 in FIG. 2.

Voltage offset terms can be applied to the magnetic drivers 210-1 to 210-n and 220-1 to 220-n, to align the beam in the slit apertures 150-1 to 150-n. In the following equations, $Y_{off-i}$ and $X_{off-i}$ are the offsets applied in the Y (deflection) and X (axis-compensation) directions for the $i^{th}$ yoke so that the beam is centered in the slit aperture immediately below.

$$X_i = \{(X_{in} + X_{off-i})\cos(\theta_i) - (Y_{in} + Y_{off-i})\sin(\theta_i + \delta\theta_i)\} X_{cal-i}$$

$$Y_i = \{(Y_{in} + Y_{off-i})\cos(\theta_i + \delta\theta_i) + (X_{in} + X_{off-i})\sin(\theta_i)\} Y_{cal-i}$$

In practice, the $X_{in}$ and $Y_{in}$ terms (applied to all yokes) are set to zero, and the $Y_{off-i}$ and $X_{off-i}$ voltages are varied about an adjustable DC level (offset scan). For each yoke 200-i, the beam is raster-scanned using drivers 210-i and 220-i in the Y and X directions respectively, and the beam current recorded that is intercepted by the variable-width-slit aperture 150-i immediately below the yoke 200-i. The $X_{off-i}$ and $Y_{off-i}$ parameters are adjusted so that the keyhole 190 image of the variable-width slit aperture appears centered in the scan.

The curvilinear axis relies on shifting the axis of the lens to lie along the predetermined path 100 shown in FIGS. 1 and 3 by adjusting the axis compensating yokes in the presence of the magnetic field of the lenses. As such, the keyhole 190 in the variable-width aperture 150-i will appear rotated in the scan, since the yoke 200-i is being scanned by itself using $X_{off-i}$ and $Y_{off-i}$. A correction term, $G_{coff-i}$, is applied to each yoke 200-i, so that the slit aperture does not appear rotated.

$$X_i = [\{(X_{in} + X_{off-i})\cos(\theta_i) - (Y_{in} + Y_{off-i})\sin(\theta_i + \delta\theta_i)\} -$$

$$G_{coff-i}\{Y_{off-i}\cos(\theta_i + \delta\theta_i) + X_{off-i}\sin(\theta_i)\}] X_{cal-i}$$

$$Y_i = [\{(Y_{in} + Y_{off-i})\cos(\theta_i + \delta\theta_i) + (X_{in} + X_{off-i})\sin(\theta_i)\} + G_{coff-i}\{X_{off-i}\cos(\theta_i) - Y_{off-i}\sin(\theta_i + \delta\theta_i)\}] Y_{cal-i}$$

Figure 5:
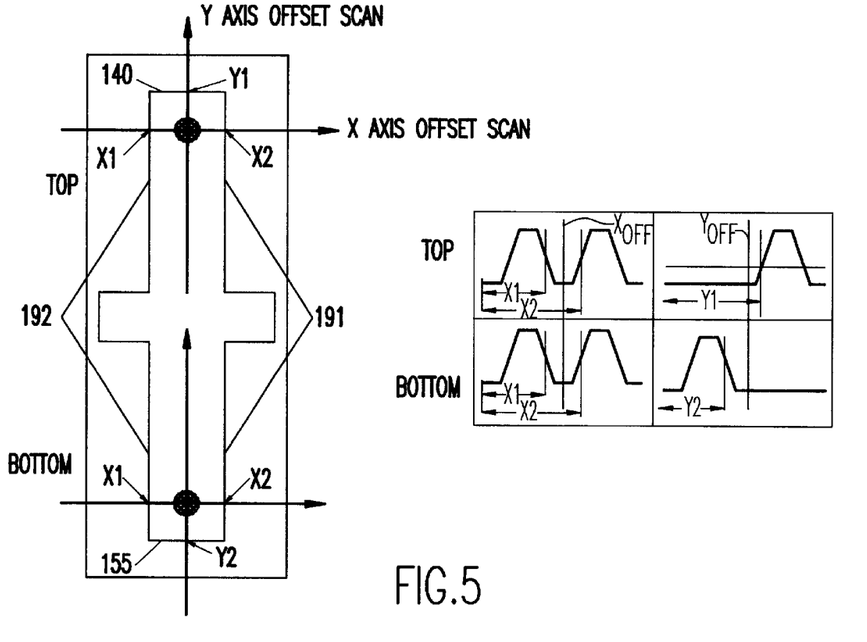
FIG. 5 is a schematic representation of a deflected beam in relation to a variable-width slit aperture, with the deflection gain and axis-compensation terms adjusted correctly.

(4) Deflection gain and axis compensation parameter adjustment procedure:

The current applied to each of the yokes 200-1 to 200-n so that the beam follows the proper planar curvilinear trajectory (proper radial displacement at each of the variable-width slit apertures 150-1 to 150-n, as shown in FIG. 5, and the deflection is constrained to lie along a plane) is facilitated by the application of two additional terms, applied to the $i^{th}$ deflector, 200-i in the voltage transformation equations above, the deflection gain term: $G_{di}$ and the axis-compensation term: $G_{ci}$.

The deflection gain term, is applied as a multiplicative constant to both $X_{in}$ and $Y_{in}$ as follows:

$$X_i = [\{(G_{di}X_{in} + X_{off-i})\cos(\theta_i) - (G_{di}Y_{in} + Y_{off-i})\sin(\theta_i + \delta\theta_i)\} - G_{coff-i}\{Y_{off-i}\cos(\theta_i + \delta\theta_i) + X_{off-i}\sin(\theta_i)\}] X_{cal-i}$$

$$Y_i = [\{(G_{di}Y_{in} + Y_{off-i})\cos(\theta_i + \delta\theta_i) + (G_{di}X_{in} + X_{off-i})\sin(\theta_i)\} + G_{coff-i}\{X_{off-i}\cos(\theta_i) - Y_{off-i}\sin(\theta_i + \delta\theta_i)\}] Y_{cal-i}$$

where $-1 < G_{di} < 1$. The offset terms, $X_{off-i}$ and $Y_{off-i}$, are not deflection gain-dependent (so that the centering of the beam into a variable-width slit aperture 150-i does not change if the deflection gain is changed), and as shown in the above gain terms, $G_{di}$, are unique to each yoke 200-i.

The object of the axis-compensation term in the $i^{th}$ yoke, 200-i is to cancel the radial component of the magnetic field from the lenses at the point where the yoke is located. As taught in the prior-art, the radial component of the lens field varies as the product of the radial displacement of the beam from the optical axis and the axial derivative of the lens field. Multiple yokes, in close proximity, as shown by 200-1 to 200-n in FIG. 1 can be used to generate a smoothly-varying field which cancels the radial component of the field, along the beam trajectory. As stated earlier, without the axis compensation, the deflection would be helical. The axis compensation can therefore be thought of as a rotation or "cross coupling" applied to counteract the helical, rotation. The axis compensation terms, $G_{ci}$ are applied to the equations above as:

$$X_i=[\{(G_{di}X_{in+}X_{off-i})\cos(\theta_i)-(G_{di}Y_{in+}Y_{off-i})\sin(\theta_i+\delta\theta_i)\}-\{(G_{ci}Y_{in}+G_{off-i}Y_{off-i})\cos(\theta_i+\delta\theta_i)+(G_{ci}X_{in}+G_{hd\ coff-i}X_{off-i})\sin(\theta_i))\}]W_{cal-i}$$

$$Y_i=[\{(G_{di}Y_{in+}Y_{off-i})\cos(\theta_i+\delta\theta_i)+(G_{di}X_{in+}X_{off-i})\sin(\theta_i)\}+\{(G_{ci}X_{in}+G_{coff-i}X_{off-i})\cos(\theta_i)-(G_{ci}Y_{in}+G_{coff-i}Y_{off-i})\sin(\theta_i+\delta\theta_i)\}]W_{cal-i}$$

where $-1 < G_{ci} < 1$.

The axis compensation term, $G_{ci}$, required for yoke 200-i, depends on the position of the beam in the lens field, but it is not necessarily a function of the amount of deflection, $G_{di}$ applied by this yoke, which might be applying little or no extra deflection to the entire beam. Even if $G_{di}=0$, there might need to be a non-zero axis compensation term, $G_{ci}$ applied at this yoke, because the beam might have entered this yoke off of the undeflected optical axis, by the action of the yokes above the $i^{th}$ one, i.e., 200-1 to 200-(i-1). The axis compensation term $G_{ci}$, can be thought of as a "group" axis compensation term, acting on yoke 200-i, since it is used to cancel the radial lens field at the position of yoke 200-i, when the beam has been deflected by all of the yokes above, 200-1 to 200-i.

The procedure for determining the correct values for the deflection gain $G_{di}$, and axis-compensation term $G_{ci}$ for yoke 200-i is given in this section. As mentioned above, the beam is statically deflected (by the action of all yokes 200-1 to 200-i, and then scanned about the nominal values of $X_{off-i}$ and $Y_{off-i}$, of yoke 200-i, so that the position of the beam can be determined relative to the edges 191, 192 and either 140 or 155, of the variable-width slit aperture 150-i.
(There may be specific instances where the static deflection from all of the yokes 200-1 to 200-i is sufficient to deflect the beam the proper magnitude, but the distance scanned by $X_{off-i}$ and $Y_{off-i}$ of yoke 200-i is not sufficient to cross the edges 191, 192, 140 or 155 of slit aperture 150-i. In those cases, it might be necessary to scan the two adjacent yokes, 200-i and 200-(i-1) to locate the edges of variable-width-slit aperture 150-i.)

Then the beam is statically deflected in the opposite direction and scanned about the nominal values of $X_{off-i}$ and $Y_{off-i}$ of yoke 200-i. The effect of scanning the offset scan terms $X_{off-i}$ and $Y_{off-i}$, is shown in FIG. 5. The deflection $G_{di}$, and axis-compensation $G_{ci}$ terms are adjusted, for yoke 200-i, so that the deflection magnitude and direction are correct at variable-width aperture 150-i.

The solid circles in FIG. 5 indicate the position of the beam in response to the static deflection. A drawing of the current intercepted on the variable-width aperture as a function of the offset scans is shown on the right-side of FIG. 5.

Figure 6:
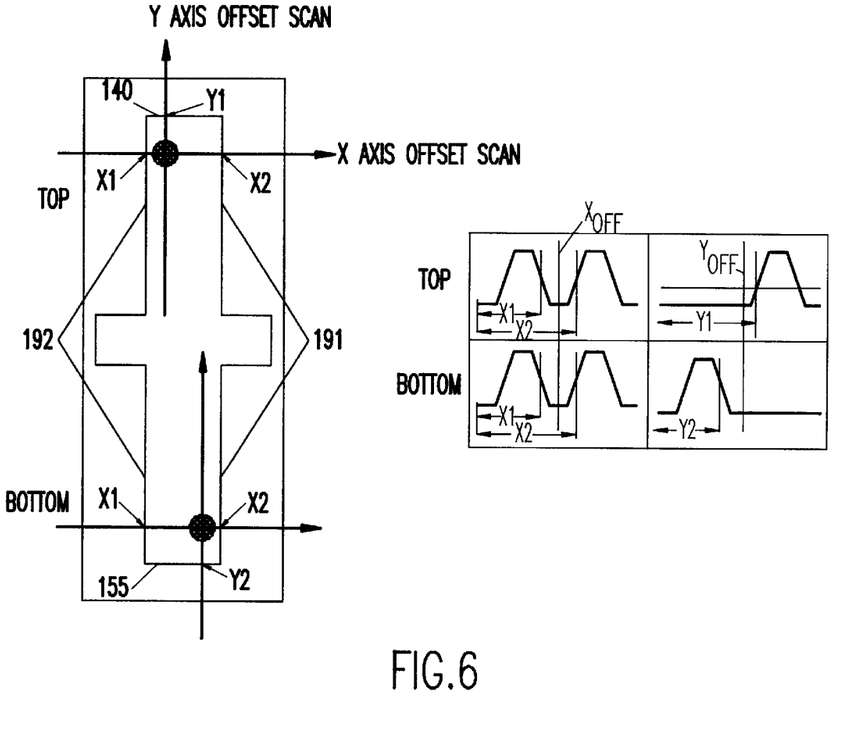
FIG. 6 is a schematic representation of a deflected beam in relation to a variable-width slit aperture, with the deflection gain and axis-compensation terms misadjusted.

The axis compensation term, $G_{ci}$ for yoke 200-i, as measured by the current intercepted on slit aperture 150-i, is set up properly when the distance from the beam to one of the long edges 191 or 192 of the aperture is the same for both directions of the static deflection using all of the yokes above and including yoke 200-i. Referring to FIG. 5, the correct condition exists when $X1_{bottom}=X1_{top}$, or $X2_{bottom}=X2_{top}$. The X's refer to the offset scan current which is bipolar and centered about $X_{off-i}$. FIG. 6 shows the case where the axis compensation term $G_{ci}$ is set incorrectly, e.g., $X1_{bottom} \neq X1_{top}$, and $X2_{bottom} \neq X2_{top}$.

As discussed earlier, the dimension 180 of any variable width aperture 150-i is 3 mm wider than the deflection at that axial position, and the dimension 170 is 3 mm for each of the apertures. The position of the beam at each slit aperture 150-i, caused by the static deflection, can be determined by measuring the position of beam relative to the wide ends, 140 or 155 of the aperture. Referring to FIG. 5, the deflection gain $G_{di}$ of yoke 200-i, is correct when $$\frac{X2_{top}-X1_{top}}{Y1_{top}-Y2_{bottom}}=1.$$

Scans are shown symbolically, after the adjustments for the axis compensation, $G_{ci}$, and deflection gain, $G_{di}$ terms have been properly adjusted. FIG. 6 shows the scans, symbolically, before the adjustments for the axis compensation, $G_{ci}$, and deflection gain, $G_{di}$ terms have optimized.

Figure 7:
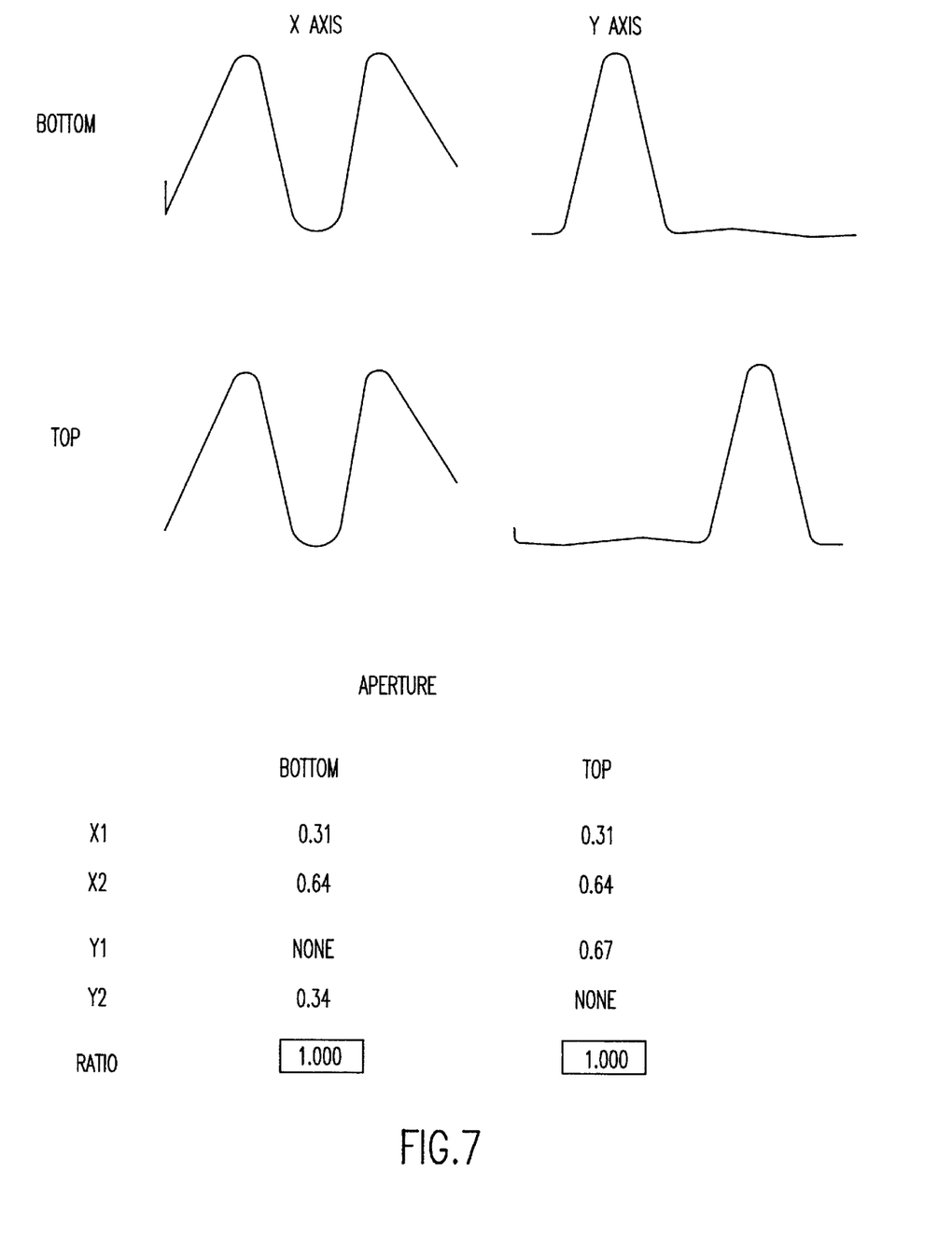
FIG. 7 is a two-dimensional image of the intercepted current onto a variable-width slit aperture from a "reduction to practice" setup of the invention.

FIG. 7 shows data from scans that were taken after this technique was reduced to practice, along with an image from a computer screen, which is updated in real-time.

Figure 8:
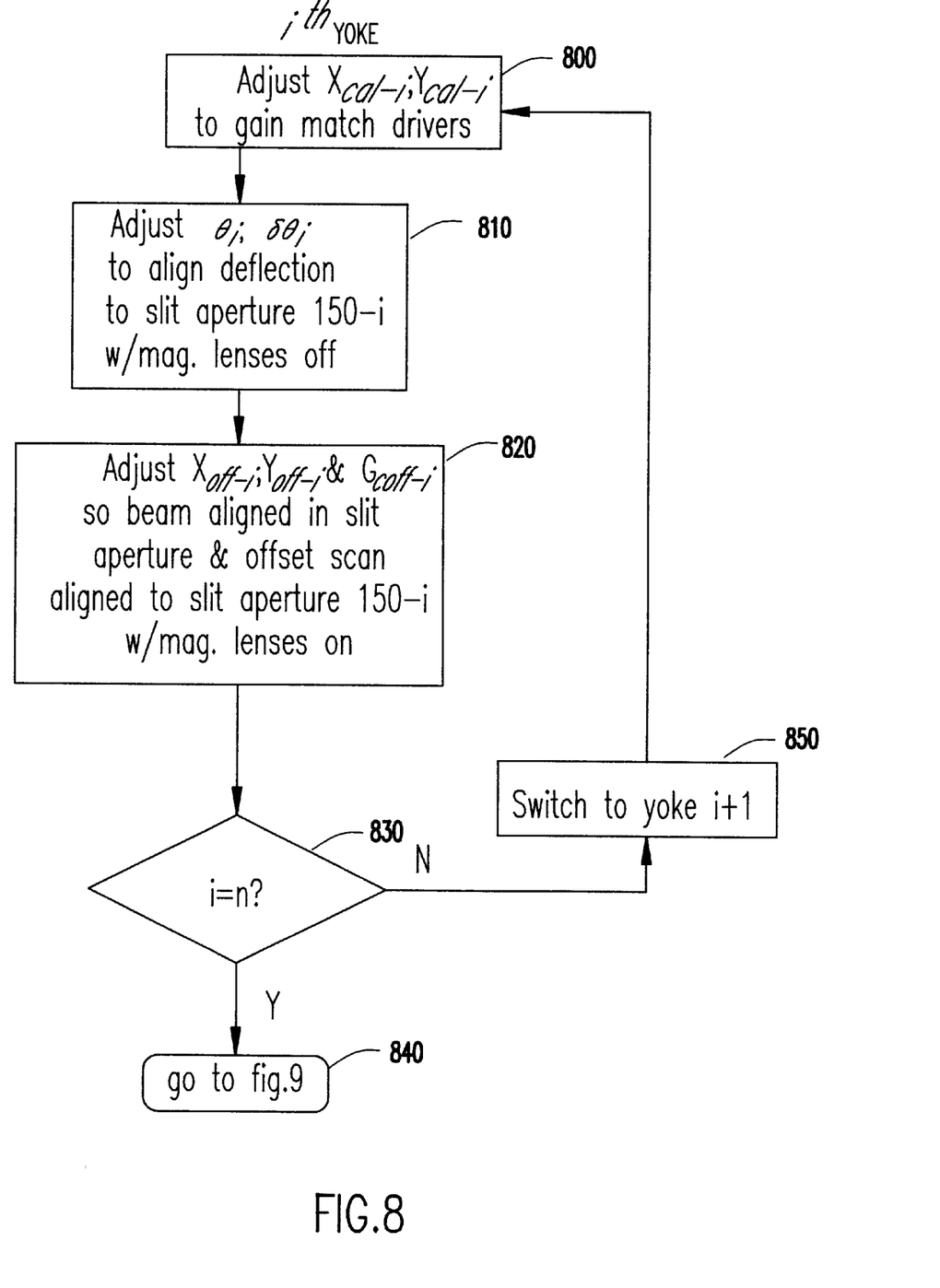
FIG. 8 is a flowchart discussing details of the Curvilinear axis setup technique, performed with magnetic lenses off in the vicinity of the magnetic yokes
Figure 9:
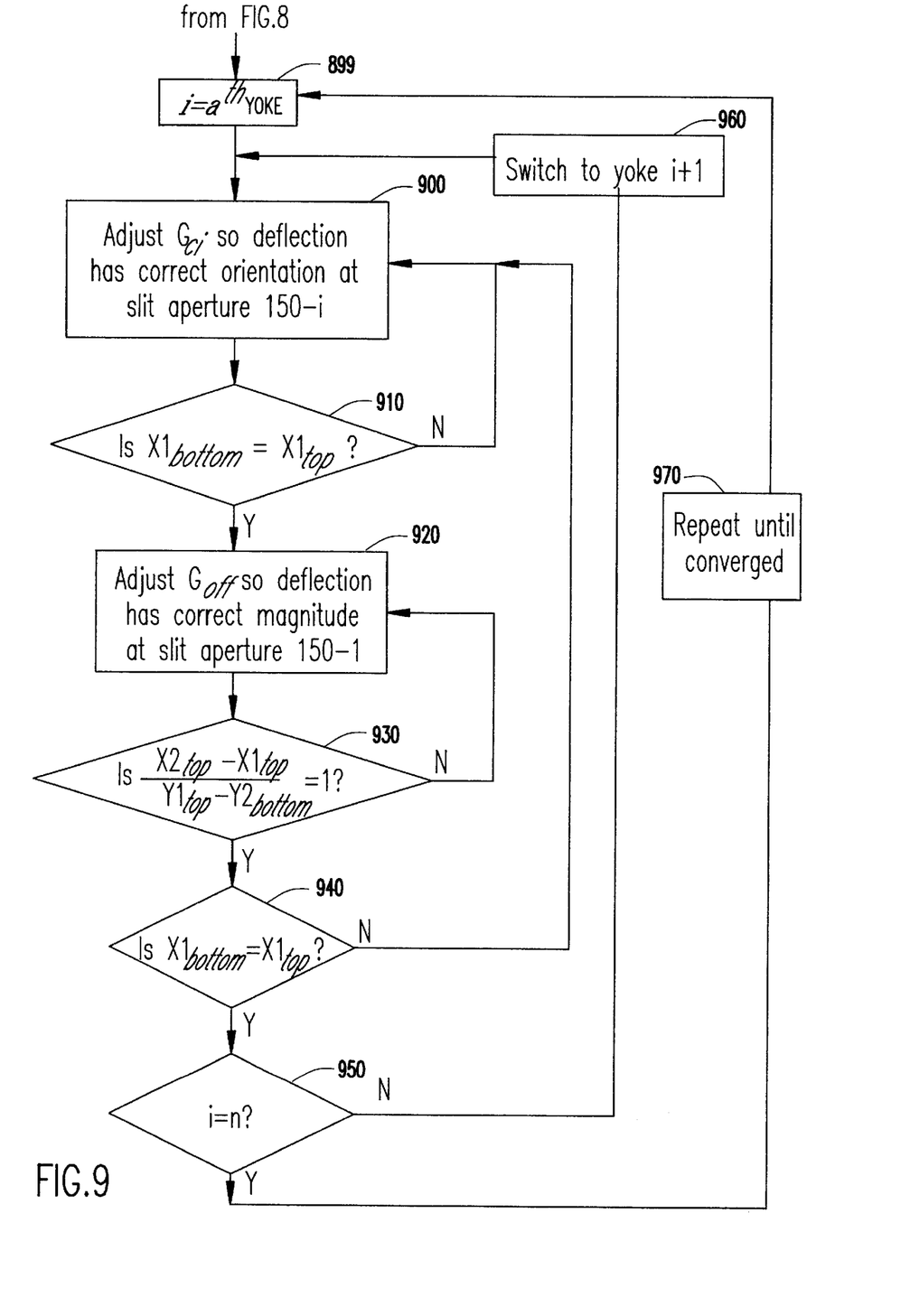
FIG. 9 is a flowchart discussing additional details of the Curvilinear axis setup technique, performed with the magnetic yokes energized.

FIGS. 8 and 9 show flow charts for the complete planar curvilinar axis setup. A flowchart is shown in FIG. 8 where each yoke 200-i is energized one at a time and the response on the variable-width slit aperture immediately below 150-i is recorded. This procedure is not iterative, but progresses from one yoke and variable-width aperture pair to the next pair along the optical axis of the system. The gain of the drivers is adjusted as indicated in step 800 to achieve equal deflection sensitivity and thus produce equal deflection for equal deflection input (step 1, Calibration). In step 810 the driving currents are adjusted so that the deflection from yoke 200-i lies along the open area of the variable-width slit aperture 150-i directly underneath the yoke (in the absence of magnetic fields) (step 2, Deflection/Axis Compensation Orientation). Step 820 comprises the procedures at each yoke 200-i, of offsetting the beam so that it is nearly centered in the slit aperture 150-i, and ensuring that the offset scan orientation, in the presence of magnetic fields from neighboring lenses, lies along the edges of the variable-width slit aperture (step 3, Offsets to center beam in slit apertures). Steps 800–820 are repeated for each yoke 200-i in the system until the $n^{th}$ yoke, 200-n, has been adjusted.

FIG. 9 shows a flowchart for the adjustment procedure to set the axis-compensation $G_{ci}$ and deflection gain $G_{di}$ terms of each yoke 200-1 to 200-n along the optical axis of the system (step 4, Deflection gain and axis compensation parameter adjustment procedure). This procedure is highly iterative, since the magnetic fields from each yoke 200-i overlap with the fields from the neighboring yokes 200-(i–1) and 200-(i+1). As mentioned earlier, the beam is statically deflected by all of the yokes above the variable-width aperture of interest, 150-i, and then scanned about the nominal values of $X_{off-i}$ and $Y_{off-i}$, using yoke 200-i (or scanned about the nominal values of $X_{off-i}$ and $Y_{off-i}$ for yoke 200-i and $X_{off-(i-1)}$ and $Y_{off-(i-1)}$ for yoke 200-(i-1), if necessary). Then the beam is statically deflected in the opposite direction (by all of the yokes above the aperture 150-i and scanned about the nominal values of $X_{off-i}$ and $Y_{off-i}$). Beginning with the first of the n yokes, 200-1, as shown by step 899, the axis compensation parameter $G_{ci}$ is determined as shown in FIGS. 5 and 6 and adjusted until $X1_{bottom}=X1_{top}$ as shown by step 910. Next, as shown by step 920, the deflection gain $G_{di}$, is adjusted until $$\frac{X2_{top}-X1_{top}}{Y1_{top}-Y2_{bottom}}=1.$$

Since adjusting the deflection gain $G_{di}$, affects the axis compensation $G_{ci}$, (and vice-versa) it is necessary as shown in step 940 to go back and check that the axis compensation term $G_{ci}$ is still correct. The loop from step 900 to step 940 is repeated until for a given yoke 200-i, both the axis compensation and deflection terms are correct. The same procedure is repeated for yoke 200-(i+1) as shown in step 960 until the axis compensation and deflection terms all n yokes in the optical system have been adjusted correctly.

It is then necessary, as shown by step 970, to reiterate the procedure for all n yokes 200-1 to 200-n, because adjusting the axis compensation and deflection terms at yoke 200-i, can affect the trajectory of the beam above. This procedure has been shown to converge. To ensure that the deflection is planar and has the proper magnitude at the reticle 103 and wafer 104 planes it is desirable to use a variable-width aperture or other suitable target and detector at these planes.

Figure 10:
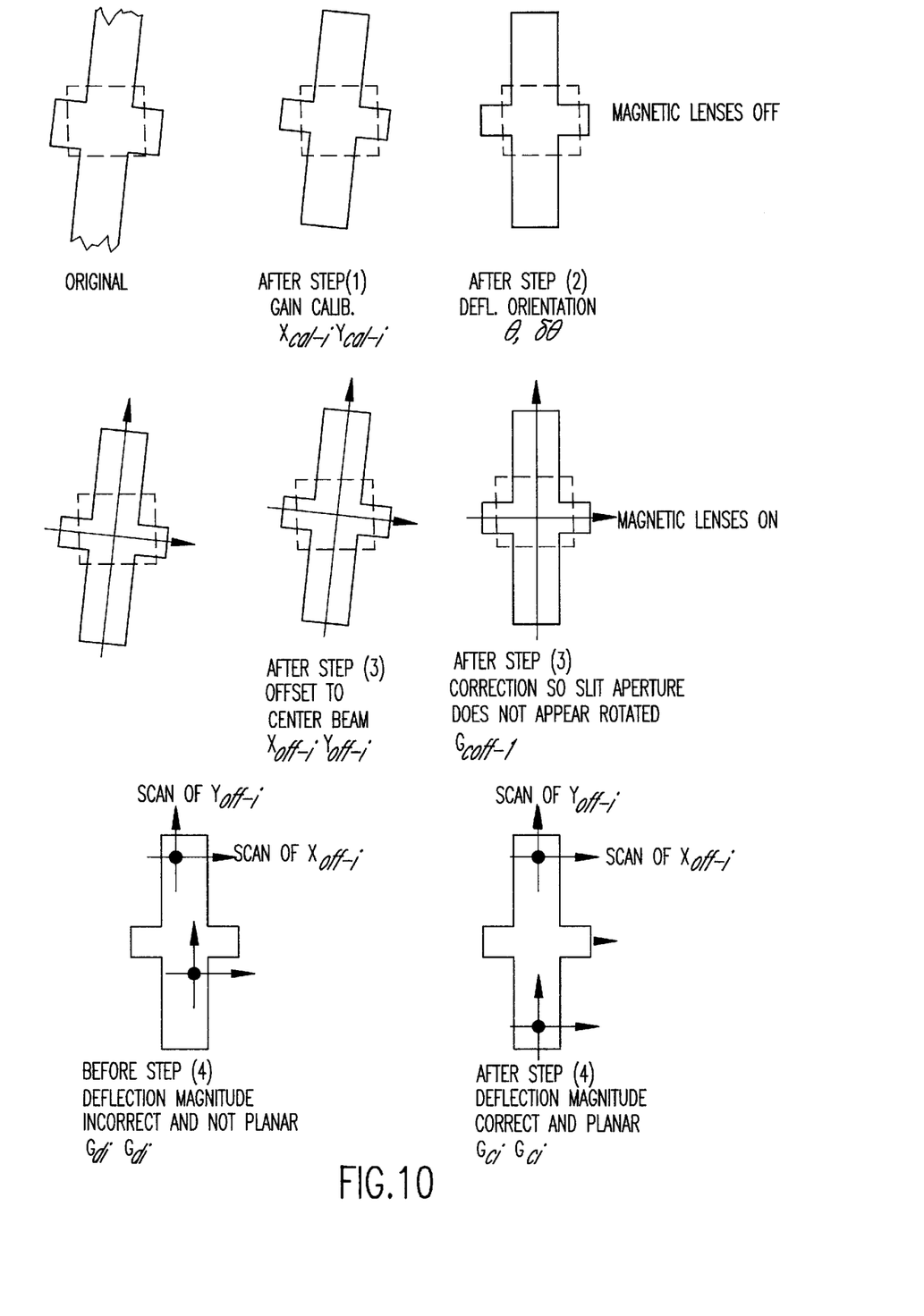
FIG. 10 is a pictoral representation of the 4 steps described herein for setting up the deflection to follow the Curvilinear axis.

FIG. 10 summarizes the entire curvilinear calibration procedure and illustrates the effects of the correct application of each of the calibration terms. The upper panel shows the effect of the gain adjustment as well as the deflection orientation, with the magnetic lenses off (step 1, Calibration and step 2, Deflection/Axis Compensation Orientation). The slit aperture may appear to have the wrong aspect ratio and rotated with respect to the scan direction. The middle panel shows the effect of making the adjustments shown in step 3, Offsets to center beam in slit apertures. Finally, in the lower panel, the results of making the adjustments in step 4, Deflection gain and axis compensation parameter adjustment procedure are shown.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of aligning a charged particle beam system having a plurality of deflectors arranged along a path of a charged particle beam, said method comprising the steps of positioning a slit aperture along said path of said charged particle beam at a position corresponding to at least one of said plurality of deflectors, said slit having a width corresponding to a desired deflected trajectory of said charged particle beam, statically deflecting said charged particle beam to a maximum deflection in a first direction using said at least one of said plurality of deflectors and all deflectors prior to said at least one of said plurality of deflectors along said path of said charged particle beam, scanning said charged particle beam over edges of said slit aperture, recording current of said charged particle beam intercepted by said slit aperture, statically deflecting said charged particle beam to a maximum deflection in a direction opposite to said first direction using said at least one of said plurality of deflectors and all deflectors prior to said at least one of said plurality of deflectors along said path of said charged particle beam, scanning said charged particle beam over edges of said slit aperture, recording current of said charged particle beam intercepted by said slit aperture during said scanning steps, and correcting said deflected trajectory of said charged particle beam in accordance with said current recorded in said recording steps.

2. A method as recited in claim 1, wherein said steps of scanning said charged particle beam is performed using said at least one of said plurality of deflectors.

3. A method as recited in claim 1, wherein said steps of scanning said charged particle beam is performed using said at least two of said plurality of deflectors.

4. A method as recited in claim 1, wherein a slit aperture is provided for each of a plurality of deflectors of said charged particle beam system.

5. A method as recited in claim 4, wherein widths of respective ones of said slit apertures define a planar curvilinear deflection path for said charged particle beam.

6. A method as recited in claim 1, wherein said charged particle beam is an electron beam.

7. A method as recited in claim 1, wherein said correcting step includes calibration of deflection current in said at least one deflector corresponding to said slit aperture.

8. A method as recited in claim 1, wherein said correcting step includes adjustment of deflection current of said deflector corresponding to said slit aperture, said deflection current corresponding to orthogonal deflection directions.

9. A method as recited in claim 8, wherein said adjustment of deflection current includes adjustment of gain of a driver circuit for said deflector.

10. A method as recited in claim 1, including the further step of deflecting said charged particle beam in a direction orthogonal to said first direction over edges of said slit aperture adjacent an undeflected path of said charged particle beam, recording current of said charged particle beam intercepted by said slit aperture, and correcting said centering of said charged particle beam path in accordance with said current recorded in said recording steps.

11. A method as recited in claim 1, wherein said slit aperture is aligned with at least one of a reticle and a target stage of said charged particle beam system.

12. A method as recited in claim 1, wherein said steps of static deflection, scanning, recording current intercepted by said slit aperture and correction of said deflected trajectory of said charged particle beam are performed in sequence for each deflector along said charged particle beam path to provide a correction sequence.

13. A method as recited in claim 12, wherein said correction sequence is performed for calibration of deflectors of said charged particle beam system and repeated for correction of deflection direction.

14. A method as recited in claim 13, wherein said correction sequence is repeated for correction of centering of said path of said charged particle beam.

15. A method as recited in claim 14, wherein said correction sequence is repeated for correction of deflection gain and axis compensation.

\* \* \* \* \*